United States Patent [19]
Berenguer et al.

[11] Patent Number: 5,990,013
[45] Date of Patent: *Nov. 23, 1999

[54] PROCESS FOR TREATING A SEMICONDUCTOR SUBSTRATE COMPRISING A SURFACE-TREATMENT STEP

[75] Inventors: Marc Berenguer, Revel; Michel Pons, Meylan, both of France

[73] Assignee: France Telecom, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/982,566

[22] Filed: Dec. 2, 1997

[30] Foreign Application Priority Data

Dec. 4, 1996 [FR] France ................................... 96 14875

[51] Int. Cl.⁶ .................................................. H01L 21/302
[52] U.S. Cl. ........................... 438/706; 438/710; 438/714
[58] Field of Search ..................... 438/706, 710, 438/714

[56] References Cited

U.S. PATENT DOCUMENTS

| | | | |
|---|---|---|---|
| 4,361,033 | 11/1982 | Kim et al. ................................. | 73/64.4 |
| 4,855,016 | 8/1989 | Jucha et al. ............................... | 438/714 |
| 4,937,055 | 6/1990 | Kittler et al. ............................. | 427/126 |
| 5,266,309 | 11/1993 | Gardella, Jr. et al. ................ | 424/78.09 |
| 5,281,546 | 1/1994 | Possin et al. ............................. | 438/710 |
| 5,723,383 | 3/1995 | Kosugi et al. ............................ | 438/710 |

FOREIGN PATENT DOCUMENTS

| | | |
|---|---|---|
| 0 345 107 | 12/1989 | European Pat. Off. . |
| 0 560 617 | 9/1993 | European Pat. Off. . |
| 0 630 989 | 12/1994 | European Pat. Off. . |
| 2 245 600 | 1/1992 | United Kingdom . |

OTHER PUBLICATIONS

Thin Solid Films, vol. 222, No. 1/02, Dec. 20, 1992, pp. 126–131, XP000345492 Ramm J. et al: Low–Temperature in Situ Claening of Silicon Wafers with an Ultra High Vacuum Compatible Plasma Source.

Journal of the Electrochemical Society, vol. 141, No. 11, Nov. 1, 1994, pp. 3136–3140, XP000493875 Carter R. J. et al.: "In Situ Remote H–Plasma Cleaning of Patterned SI–SI02 Surfvaces".

*Primary Examiner*—William Powell
*Assistant Examiner*—Kin-Chan Chen
*Attorney, Agent, or Firm*—Fulbright & Jaworski L.L.P.

[57] ABSTRACT

A process for treating a semiconductor substrate, comprising a prior surface-treatment step using a plasma at medium or low pressure, preferably having an electron concentration $N_e \geq 10^{11}$ cm$^{-3}$ and preferably producing a small potential difference $V_p - V_f < 20$ V, wherein the surface energy of the treated surface is determined so as optionally to have fast feedback on the control of the process in order to optimize the plasma treatment, and the prior surface treatment step may be followed by a deposition step with a view to filling or planarizing the treated surface or to improving morphological, physical, or electrical characteristics of materials deposited on the treated surface.

13 Claims, No Drawings

PROCESS FOR TREATING A SEMICONDUCTOR SUBSTRATE COMPRISING A SURFACE-TREATMENT STEP

FIELD OF THE INVENTION

The present invention relates to a process for treating a semiconductor substrate in the production of integrated circuits.

BACKGROUND OF THE INVENTION

The increase in the integration density and the speed of integrated circuits is leading to a continuous reduction in the size of the elementary transistors of which they are composed. Indeed, the development of fabrication technologies is, in particular, characterized by a reduction in the lateral dimensions which is taking place more quickly over time than that of the vertical dimensions (for example the minimum widths of the photolithographically etched patterns are being reduced at a faster rate than the typical thicknesses of the deposited layers). In certain cases, this results in a significant increase in the form factors (depth/width ratio of a pattern) in comparison with previous-generation technologies, and therefore in a tortuous relief.

Furthermore, deposits made on non-planar surfaces of this type are involved in certain fabrication steps for integrated circuits. Among these, mention may be made of the side insulation techniques which require the deposition of one or more dielectric layers in trenches etched into the silicon, as well as intermetallic insulation techniques.

On account of the tortuous relief of the surface which receives the deposit, morphological defects may appear in these deposited layers. Mention may, principally, be made of cavity effects, crackling effects and wave effects (periodic or pseudo-periodic variations in the thickness over large distances).

It is therefore expedient to find deposition processes which overcome these drawbacks that are connected, in particular, with the geometry of the underlying patterns and the inherent physical characteristics of the materials that are deposited.

SUMMARY OF THE INVENTION

The inventors have developed a process for treating a semiconductor substrate, comprising a prior surface-treatment step which, in the specific case of deposition operations for the side insulation technique or the intermetallic insulation technique, or of any other structure which fulfils similar functions, makes it possible to reduce or even eliminate morphological defects such as crackling, cavities or waves, while maintaining or improving the morphological, physical and electrical characteristics of the material that is deposited.

The treatment process according to the invention reacts on the physical condition of the surfaces on which the deposits are made. This condition is characterized by the surface energy, this being an energy which can change over time, for example as a result of possible pollution. From a theoretical point of view, the surface energies are involved, for example, in the expression of the work of adhesion of a liquid on a solid surface. This work can also be given by the Young-Dupre equation, which involves the surface energy of the liquid and the contact angle of the liquid drop on the solid.

The treatment process according to the invention more particularly makes it possible to stabilize the surface controlling the structure of the deposit, by rendering the surface energy uniform and reproducible.

The invention thus relates to a process for treating a semiconductor substrate, which comprises a prior surface-treatment step comprising the following steps:

a) pretreating the surface using a plasma at medium or low pressure;

b) determining the surface energy of the surface thus treated; and c) optionally repeating step a) depending on the results obtained in step b).

The precursor gases used for the plasma in step a) are principally nitrogen, oxygen, nitrogen oxide, hydrogen, argon, silane, as well as mixtures of these gases. The reason for this is that they have been found to produce atoms or radicals capable of modifying the surface energy with a very broad range of effects.

The surface pretreatment step according to the invention can be carried out in any type of suitable reactor.

DETAILED DESCRIPTION OF THE INVENTION

According to a preferred embodiment of the process of the invention, the surface treatment is carried out in a source having a high plasma density and therefore a high active species density with $n_e \geq 10^{11}$ cm$^{-3}$. The reason for this is that using a reactor of this type permits an effective surface treatment in a very short time, equal to or less than 2 minutes.

According to another preferred aspect of step a), the surface pretreatment is carried out while setting up a small potential difference (plasma potential–floating potential), in particular $V_p - V_f < 20$ V.

In step b), the surface energy of the pretreated surface is preferably determined using a sensitive and fast characterization method, for example measuring the contact angle of a liquid drop on the surface, a method which is moreover simple and non-destructive, allowing fast feedback for the control of the pretreatment step.

The treatment process according to the invention is particularly recommended when the surface of the semiconductor to be treated is not planar and has form factors of typically between 2 and 6.

According to a first embodiment of the invention, further to the surface-treatment step, the treatment process comprises at least one deposition step with a view to filling and/or planarizing the treated surface. If the treatment process according to the invention includes a plurality of deposition steps, these steps are separated from one another by repetition of the prior surface-treatment step described above.

According to a preferred embodiment of the invention, the prior surface-treatment step and the deposition step are carried out in the same reactor. The most suitable plasma reactors are low-pressure sources with high density and independent polarization.

According to one aspect of the invention, the material deposited in the subsequent step of the treatment process of the invention is a dielectric deposited with a view to side trench insulation of future active regions of the semiconductor substrate or with a view to intermetallic insulation.

According to another aspect of the invention, the material deposited is a conductor material with a view to establishing interconnections in the semiconductor substrate. As in the case of dielectrics, the expected effect is a modification (improvement) of the physical and, more particularly, mechanical characteristics of the material, the process being developed in similar fashion.

Other types of deposits may be envisaged, and comprise the deposition of a material chosen from dielectrics, polymers deposited using plasma and polysiloxanes in solution deposited using the spin on glass (SOG) process.

According to another embodiment of the process of the invention, the surface treatment is employed not directly with a view to improving a subsequent deposit, but, for example, with a view to improving the physical condition of a surface, for example in order to convert an SOG layer into an $SiO_2$-like material, or to passivate the surface of a planarizing deposit.

According to a preferred embodiment of the invention, the process comprises a plurality of steps of depositing a dielectric, preferably silicon oxide, with a view to filling and planarizing a surface having variable patterns. This preferred embodiment of the process of the invention comprises the following successive steps:

1. the prior surface treatment carried out on a thermal oxide formed in the trenches produced in the semiconductor substrate, with an $N_2O$ plasma according to steps a) to c) described above;
2. deposition by PECVD at low pressure of a first layer of silicon oxide;
3. repetition of step 1;
4. deposition by CVD of a planarizing silicon oxide layer of the APL type;
5. surface treatment using $O_2$ plasma according to steps a) to c) described above;
6. repetition of step 1;
7. Deposition by PECVD at low pressure of a so-called encapsulation silicon oxide layer, the duration of this deposition being greater than that of the deposition in step 2.

According to this preferred embodiment of the invention, a box-type structure is obtained without a cavity or a wave effect, with a markedly increased degree of planarization.

Other advantages and characteristics of the invention will emerge on studying the detailed description of applications and embodiments of the invention, which do not imply any limitation.

The invention relates to a process for treating a semiconductor substrate which is employed during the fabrication of integrated circuits. This treatment process comprises a prior surface-treatment step, advantageously implemented before a deposition on the treated surface. This step of surface treatment of the semiconductor substrate makes it possible to modify the various polar, non-polar and topographical components of the surface energy which characterizes the microscopic physical condition of the said surface. It is thus possible to determine the conditions for which the surface energy is reproducible and uniform over the treated surface. This stabilization of the surface allows a very substantial improvement in the morphological and topographical characteristics of a deposit made after the surface treatment, and furthermore makes it possible to maintain or improve the electrical characteristics of the material which is deposited.

The nature of the treated surface can vary. It may be a semiconductor substrate such as silicon or a silicon-based alloy, a dielectric material, and in particular silicon oxide, for example a thermal oxide or an oxide deposited by CVD or PECVD, or a metal, in particular with a view to establishing interconnections in a semiconductor substrate, or a polymer such as an SOG polysiloxane.

The surface treatment is generally carried out in two steps, or even three or more. The main steps in this process comprise:

a) pretreating the surface using a plasma at low or medium pressure.

Low or medium pressure is understood to mean pressures of between 0.5 mtorr and 1000 mtorr. Specifically, the operating pressure range of the plasma surface treatment is directly connected with the types of reactors or plasma sources which are used. These pressure ranges do not differ significantly from those of the processes (deposition, etching) for which the reactors are normally designed. Certain reactors operate at medium pressure, of the order of 50 to 1000 mtorr, for example an RF diode source normally used for oxide PECVD. For their part, plasma sources of more recent generation (ECR, DECR, inductive coupling, helicon, etc.), normally used for depositing and for etching, constitute examples of systems operating at low pressure, typically of the order of 0.5 to 10 mtorr.

According to a preferred embodiment of the process of the invention, the surface is pretreated in a source of more recent generation, which makes it possible to set up a high plasma density, and therefore a high active species density with, in particular, an electron concentration $n_e \geq 10^{11}$ cm$^{-3}$. Indeed, this type of source leads to an effective surface treatment in a very short time, typically less than or equal to 2 minutes.

Using low-density reactors, of older generation, for which $n_e << 10^{11}$ cm$^{-3}$, leads to treatments which are longer but may nevertheless be envisaged in the scope of the invention and are compatible with industrial applications, in particular if the treatment is to be carried out on a plurality of samples at once (batch reactors).

This plasma treatment should supply the lowest possible ion bombardment energy so as not to create defects on the treated surface. This is why the treatment is preferably carried out in such a way as to produce a small difference between the plasma potential and the floating potential, typically $V_p - V_f < 20$ V.

The surface energy components of the treated surface will advantageously be set uniformly if the pretreatment is carried out with floating potential, thus producing a low ion bombardment energy since no external electrical polarization is applied to the sample. A treatment of this type leads to a gentle physico-chemical surface transformation by grafting atoms or by opening polar bonds. If a strong polarization is applied, the ion bombardment energy is increased, which leads to a physical transformation of the surface, specifically an increase in the roughness by the sputtering effect. A treatment of this type may lead to the creation of defects in the treated surface.

The precursor gases used for the plasma treatment are neutral or reactive precursor gases, for example Ar, $H_2$, $N_2$, $O_2$, $N_2O$, $SiH_4$, as well as combinations or mixtures of these elements. Use will principally be made of $H_2$, $N_2$, $O_2$, $N_2O$ and $SiH_4$, which make it possible to produce atoms or radicals capable of modifying the surface energy with a very broad range of effects.

b) Determining the surface energy of the pretreated surface.

The plasma pretreatment leads to an overall modification of the surface energy in terms of its polar and non-polar components, and this modification can be regulated with a view to possible process control in order to optimize the plasma treatment. Several known methods of determining the components of the surface energy can be employed. Nevertheless, the preferred method consists in measuring the contact angle of a liquid drop with the treated surface, this method having the advantages of being simple, sensitive and non-destructive and allowing fast feedback for process control. In practice, the experiment is generally carried out with two liquids and two angle values are thus measured, corresponding to the two components, polar and non-polar, of the surface energy. More information regarding the physical change of the surface is thus obtained. The liquids used may, for example, be water for determining the change in the polar component and diiodomethane for determining the change in the non-polar component.

c) Optional repetition of step a) depending on the results obtained in step b) with a view to optimizing the surface treatment.

According to the process of the invention, a plurality of surface treatment loops (plasma treatment+contact angle measurement+process control+plasma treatment+contact angle measurement+. . . ) can be carried out in the study proper, leading to the process becoming fine-tuned. Once this step has been carried out, and after the reproducibility of the treatment has been checked, the surface treatment process can be used in a circuit fabrication system. These control loops can then be omitted or integrated with the industrial process.

As indicated above, a preferred embodiment of the treatment process of the invention consists in producing a deposit after the surface-treatment step. The nature of this deposit may vary. It may be a deposit of a metallic material with a view to establishing interconnections in the vias of an integrated circuit, a deposit of plasma-deposited polymers or of polysiloxanes in solution, of the spin on glass type, as well as any other deposit of a dielectric, in particular with a view to filling trenches and/or planarizing in techniques of side insulation using trenches, of the box type, or of intermetallic insulation or any other structure fulfilling similar functions.

It may be noted that, in the case of an SOG deposit, the benefit of this type of plasma treatment is that it converts this polymer into a silicon oxide-like material.

The deposition step may consist of depositing a single layer on the treated surface, or a plurality of layers. When the deposition step comprises the deposition of a plurality of layers, the surface-treatment step is repeated before the deposition of each of the layers on the underlying base layer or the underlying layer deposited according to the process of the invention.

The process of the invention is advantageously employed in the context of carrying out multilayer deposition. This is because this embodiment of the invention makes it possible to prevent the effects of morphological defects from being passed on from one layer to another, these being defects which, by combining, considerably reduce the quality of the deposit both in terms of its morphological and physical characteristics and in terms of its electrical characteristics.

A treatment process which, further to the surface treatment, comprises the step of depositing a dielectric, constitutes one of the embodiments of the invention. It is found that this embodiment leads to excellent results, and in particular the disappearance of morphological defects in the deposit which is made, while maintaining or even improving the electrical characteristics of the material.

The surface-treatment step which precedes the deposition step may be carried out in situ in the same reactor, in which case it is specific to and inseparable from the deposition step.

According to another embodiment of the invention, surface treatments according to the invention can be carried out ex situ, for example in order to convert an SOG layer into an $SiO_2$-like material, without it being necessary for a subsequent deposition to take place afterwards. It is also possible to passivate the surface of a deposit, for example a planarizing oxide type, this being carried out in a different machine. As a general rule, in situ treatment has the significant advantage of avoiding certain undesirable surface modifications (oxidation, pollution, etc.) which, in certain cases, could negate any benefit provided by the process.

The treatment process of the invention can be carried out in reactors such as the ones used in plasma CVD deposition machines, for example of the RF planar diode type. It is nevertheless preferable to carry out the treatment in more recent plasma reactors, for example low-pressure sources with high plasma density, of the DECR or ECR (for example Lam) or alternatively of the inductive-coupling type, examples of which include HDP applied materials, TCP Lam, with or without plasma confinement, which allow independent polarization.

The deposition of a dielectric, more particularly silicon oxide, which is carried out after the surface treatment, may involve PECVD, SACVD, "APL" planarizing oxide (CVD of $SiH_4$ and $H_2O_2$) or alternatively another type of CVD or plasma CVD using organic or organosilicon precursors, or precursors based on silane.

The thickness of the layer deposited according to the process of the invention, in particular the dielectric layer, may vary from about 200 nm to about 600 nm in the case of a single layer and may amount to about 1100 nm in the case of a multiple layer.

When the treatment process according to the invention comprises dielectric multilayer deposition, a so-called encapsulation layer is optionally deposited as the last layer, having sufficient thickness to protect the dielectric multilayer structure which is produced, by stopping the surface from changing and thus guarding it against undesirable interactions with the surroundings (atmospheric reoxidation, pollution, etc.). The typical thickness of a layer of this type is between 100 nm and 300 nm.

It was seen above that the plasma surface treatment can be optimized on the basis of the polar and non-polar components of the surface energy which are determined after the treatment from various contact angle measurements using suitable liquids. The characterization of the deposit which is made then gives indications regarding the effect of the treatment carried out on the deposited material. For example, the morphological characteristics of the deposit can be determined by scanning microscopy. By carrying out a parametric study, it is therefore possible to control the conditions of the plasma surface treatment with a view to the desired surface energy to improve the quality of the deposit, in particular in terms of its structure and its adhesion to the surface. These analyses may be supplemented by mechanical stress measurements as well as fine physico-chemical analyses of the surface (XPS, AFM, PEELS, etc.).

Two non-limiting examples are presented below with a view to illustrating the technique of the invention:

EXAMPLE I

Increasing the wettability by grafting nitrogen atoms on a surface of thermal oxide or silicon oxide deposited by CVD or plasma CVD.

A surface of thermal silicon oxide or silicon oxide deposited by CVD or plasma CVD is treated in a planar RF reactor of the ET planar 200 type under nitrogen oxide plasma at a medium pressure of 600 mtorr (with a flow rate of 500 sccm) and an RF power of 300 W over a time of less than 2 minutes.

After this pretreatment step, the change in the contact angle with a polar liquid (water) and a non-polar liquid (diiodomethane) is determined.

The plasma pretreatment is then repeated under the same conditions, this time using an oxygen plasma.

The contact angle is again measured.

The change in the contact angle (in degrees) is represented in the following table.

| Contact angle | Liquid used | |
|---|---|---|
| Treatment type | Water | Diiodo |
| Untreated surface | 33 | 37 |
| N$_2$O plasma treatment | 29 | 43 |
| O$_2$ plasma treatment | 31 | 46 |

A significant change in the contact angle with diiodomethane is seen. This indicates an increase in the non-polar component of the surface energy, whereas the polar component varies little. The surface treatment which is carried out therefore changes the chemistry of the surface.

EXAMPLE II

BOX trench side insulation of a surface having a semi-infinite step, patterns of variable width and patterns of set width.

After reoxidation of the silicon in the trenches made in the semiconductor substrate, to a layer thickness of about 25 nm, the thermal oxide surface is treated with cold N$_2$O plasma at a medium pressure of about 600 mtorr, a flow rate of 500 cc/minute and an RF power of 300 W, for 30 seconds.

On the thermal oxide sub-layer thus treated, a layer of silicon dioxide having a thickness of between 100 and 200 nm is deposited by plasma enhanced CVD at a low pressure of 300 mtorr with a duration of about 30 seconds.

After this deposition step, the N$_2$O plasma treatment step is repeated under the same conditions as before.

On the PECVD oxide surface thus treated, a planarizing oxide layer of the APL type is deposited by CVD, in two or three sequences of about 20 seconds and a total thickness of the order of 600 nm. The deposit is made in two or three sequences in order to increase the uniformity and the degree of planarization of the deposit.

The surface of the APL layer is then treated with cold O$_2$ plasma for about 120 seconds, the pressure and power conditions being the same as for the previous N$_2$O plasma treatment.

This O$_2$ plasma treatment step is followed by a second N$_2$O plasma treatment step which is identical to the previous ones.

On the planarizing oxide surface, a silicon dioxide layer is then deposited by plasma CVD at a low pressure over a time of about 40 seconds, in order to obtain a typical thickness of the order of 300 nm. This last layer is used as the encapsulation layer.

Under the conditions of this process, a triple insulating layer is obtained having a maximum thickness of the order of 1100 to 1200 nm. This deposit is free of morphological defects and a markedly increased degree of planarization reaching high values is observed. Specifically, the degree of planarization on the semi-infinite step is of the order of 75%.

We claim:

1. Process for treating a semiconductor substrate, characterized in that it comprises a prior surface-treatment step comprising the following steps:

a) pretreating the surface of the semiconductor substrate using a plasma at medium or low pressure and a plasma source wherein the potential difference established in the plasma source during the pretreatment is small, of the order of $V_p - V_f < 20V$;

b) determining the surface energy of the substrate treated surface by measuring the contact angle of a liquid drop with the treated surface; and c) optionally repeating step a) depending on the results obtained in step b).

2. Process according to claim 1, characterized in that precursor gases chosen from the group of H$_2$, N$_2$, Ar, O$_2$, N$_2$O and SiH$_4$, as well as mixtures of these gases, are used for the plasma.

3. Process according to claim 1, characterized in that step a) is carried out in a reactor with high plasma density, setting up an electron concentration $n_e \geq 10^{11}$ cm$^{-3}$.

4. Process according to claim 1, characterized in that the treated surface is not planar.

5. Process according to claim 4, characterized in that the treated surface locally has form factors betwen 2 and 6.

6. Process according to claim 1, characterized in that it furthermore comprises at least one step of subsequently depositing a dielectric or conductor material.

7. Process according to claim 6, characterized in that it comprises a plurality of deposition steps separated from one another by repeating the treatment step defined in claim 1.

8. Process according to claim 6, characterized in that the prior surface-treatment step and the step of deposition on the treated surface are carried out in the same reactor.

9. Process according to claim 6, characterized in that the material deposited on the treated surface is a dielectric.

10. Process according to claim 6, characterized in that the material deposited on the treated surface is a conductor material with a view to establishing interconnections in the semiconductor substrate.

11. Process according to claim 6, characterized in that the material of the surface to be treated is chosen from the group of silicon oxide deposited by CVD or PECVD, a thermal oxide, polymers deposited using a plasma and SOG-type polysiloxanes in solution.

12. Process according to claim 1, in which the semiconductor substrate has trenches with a thermal oxide formed therein, characterized in that it comprises the following successive steps:

1. the prior surface treatment using N$_2$O plasma, as defined in steps a) to c), carried out on a thermal oxide formed in the trenches of the semiconductor substrate;
   2. deposition by PECVD at low pressure of a first layer of silicon oxide;
   3. repetition of step 1;
   4. deposition by CVD of a planarizing oxide layer;
   5. surface treatment using O$_2$ plasma as defined in steps a) to c);
   6. repetition of step 1; and
   7. deposition by PECVD at low pressure of a so-called encapsulation silicon oxide layer, over a longer time than in step 2.

13. Process according to claim 1 wherein determining the surface energy in step b) comprises measuring the contact angles with the treated surface with two drops of two liquids the values of which are representative of the polar and non-polar components of the surface energy.

* * * * *